US009575880B2

(12) United States Patent
Cho

(10) Patent No.: US 9,575,880 B2
(45) Date of Patent: Feb. 21, 2017

(54) SEMICONDUCTOR MEMORY DEVICE AND MEMORY SYSTEM

(71) Applicant: SK hynix Inc., Icheon-si Gyeonggi-do (KR)

(72) Inventor: Yong Deok Cho, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 649 days.

(21) Appl. No.: 14/084,807

(22) Filed: Nov. 20, 2013

(65) Prior Publication Data

US 2014/0372664 A1    Dec. 18, 2014

(30) Foreign Application Priority Data

Jun. 17, 2013  (KR) .................. 10-2013-0068926

(51) Int. Cl.

| | |
|---|---|
| G06F 12/02 | (2006.01) |
| G11C 8/08 | (2006.01) |
| G11C 8/12 | (2006.01) |
| G11C 8/18 | (2006.01) |
| G11C 7/18 | (2006.01) |

(52) U.S. Cl.
CPC ............... *G06F 12/02* (2013.01); *G11C 8/08* (2013.01); *G11C 8/12* (2013.01); *G11C 8/18* (2013.01); *G11C 7/18* (2013.01); *G11C 2207/005* (2013.01)

(58) Field of Classification Search
CPC ............ G11C 8/08; G11C 8/12; G11C 8/18; G11C 7/12; G11C 7/18; G11C 16/08; G11C 16/10; G11C 16/24
USPC .................... 365/230.03, 230.06, 230.08, 185.11, 365/185.12, 185.13, 185.21
See application file for complete search history.

(56) References Cited

U.S. PATENT DOCUMENTS

| | | | |
|---|---|---|---|
| 6,934,214 B2 | 8/2005 | Fujisawa et al. | |
| 8,289,805 B2 * | 10/2012 | Kim | G11C 5/025 365/185.11 |
| 2007/0133313 A1 | 6/2007 | Kim | |
| 2010/0246296 A1 | 9/2010 | Park et al. | |
| 2011/0085393 A1 | 4/2011 | Kwack et al. | |
| 2012/0099390 A1 | 4/2012 | Cho | |

(Continued)

FOREIGN PATENT DOCUMENTS

| | | |
|---|---|---|
| KR | 100646980 B1 | 11/2006 |
| KR | 100668513 B1 | 1/2007 |

(Continued)

*Primary Examiner* — Gene Auduong
(74) *Attorney, Agent, or Firm* — William Park & Associates Ltd.

(57) ABSTRACT

A semiconductor memory device and a memory system are disclosed. The semiconductor memory device includes: a memory bank configured to include a first section and a second section, each of which is comprised of a plurality of memory cells; an LIO line switching circuit configured to generate first and second selection signals on the basis of page-size information; and an input/output (I/O) circuit configured to access the first section, the second section, or the first and second sections on the basis of the first and second selection signals, wherein the page-size information includes first and second information. If the page-size information is the first information, the LIO line switching circuit generates the first and second selection signals using a row address, and if the page-size information is the second information, the LIO line switching circuit generates the first and second selection signals using a column address.

20 Claims, 6 Drawing Sheets

(56) References Cited

U.S. PATENT DOCUMENTS

| | | | |
|---|---|---|---|
| 2012/0243360 A1 | 9/2012 | Ferrant et al. | |
| 2013/0044543 A1* | 2/2013 | Kim | G11C 5/025 |
| | | | 365/185.12 |
| 2013/0088911 A1* | 4/2013 | Nakura | G11C 13/0002 |
| | | | 365/148 |

FOREIGN PATENT DOCUMENTS

| | | |
|---|---|---|
| KR | 1020100107248 A | 10/2010 |
| KR | 1020110039853 A | 4/2011 |
| KR | 1020120068079 A | 6/2012 |

* cited by examiner

SEMICONDUCTOR MEMORY DEVICE AND MEMORY SYSTEM

CROSS-REFERENCE TO RELATED APPLICATION

This application claims priority under 35 U.S.C. 119(a) to Korean patent application No. 10-2013-0068926, filed on Jun. 17, 2013, in the Korean Intellectual Property Office, which is incorporated herein by reference in its entirety as set forth in full.

BACKGROUND OF THE INVENTION

Field of the Invention

Embodiments of the present invention relate to a semiconductor memory device and a memory system, and more particularly to a semiconductor memory device and a memory system which can be operated in various operational units.

Description of the Related Art

A semiconductor memory device may be implemented using a semiconductor material such as silicon (Si), germanium (Ge), germanium (Ge), gallium arsenide (GaAs), indium phosphide (InP), etc. Semiconductor memory devices are generally classified into a volatile memory device and a non-volatile memory device.

Data stored in a volatile memory is lost when power supply is stopped. Volatile memories may be classified into a static RAM (SRAM), a dynamic RAM (DRAM), a synchronous DRAM (SDRAM), etc. On the other hand, data stored in a non-volatile memory is not lost even when power supply is stopped. There are a variety of non-volatile memory devices such as a read only memory (ROM), a programmable read-only memory (PROM) device, an erasable programmable read-only memory (EPROM) device, an electrically erasable programmable read-only memory (EEPROM) device, a flash memory device, a phase change RAM (PRAM), a magnetic RAM (MRAM), a resistive RAM (RRAM), a ferroelectric RAM (FRAM), etc. The integration degree of a semiconductor memory device is considered very important in affecting throughput or performance of the device.

BRIEF SUMMARY OF THE INVENTION

Various embodiments of the present invention are directed to providing a semiconductor memory device and a memory system that substantially obviate one or more problems due to limitations and disadvantages of the related art.

An embodiment of the present invention relates to a semiconductor memory device and a memory system which are configured to reduce the size of a chip area, resulting in increased integration degree.

An embodiment of the present invention relates to a semiconductor memory device and a memory system in which a page size required for data read/write operations can be variably established.

In accordance with an aspect of the embodiment, a semiconductor memory device includes: a memory bank configured to include a first section and a second section, each of which is comprised of a plurality of memory cells; an LIO line switching circuit configured to generate first and second selection signals on the basis of page-size information; and an input/output (I/O) circuit configured to access the first section, the second section, or the first and second sections on the basis of the first and second selection signals, wherein the page-size information includes first and second information, where, if the page-size information is the first information, the LIO line switching circuit generates the first and second selection signals using a row address, and if the page-size information is the second information, the LIO line switching circuit generates the first and second selection signals using a column address.

If the page-size information is the first information, any one of the first section and the second section may be activated in a unit operation period.

If the page-size information is the second information, the first and second sections may be simultaneously or sequentially activated in a unit operation period.

The I/O circuit may include: a write driver that is coupled to the first section through a first I/O line pair in response to the first selection signal, and is coupled to the second section through a second I/O line pair in response to the second selection signal, such that data is written in the first and second sections; and a sense-amplifier circuit configured to detect a voltage difference of the first I/O line pair or the second I/O line pair according to whether the first or second selection signal is activated, thereby outputting an amplified signal.

The first I/O line pair may include a first I/O line and a first I/O inversion line, and the second I/O line pair may include a second I/O line and a second I/O inversion line.

The sense-amplifier circuit may include: a first amplifier configured to detect/amplify a voltage difference between the first I/O line and the first I/O inversion line; a second amplifier configured to detect/amplify a voltage difference between the second I/O line and the second I/O inversion line; a third amplifier configured to amplify output signals of the first and second amplifiers; a first switch unit configured to apply the output signal of the first amplifier to the third amplifier in response to the first selection signal; and a second switch unit configured to apply the output signal of the second amplifier to the third amplifier in response to the second selection signal.

The first and second selection signals may be generated on the basis of an MSB value of a row address or column address.

In accordance with another aspect of the embodiment, a semiconductor memory device includes: a write driver that is coupled to a first memory section through a first I/O line pair in response to a first selection signal, and is coupled to a second memory section through a second I/O line pair in response to a second selection signal, such that data is written in the first and second sections; and a sense-amplifier circuit configured to detect a voltage difference of the first I/O line pair or the second I/O line pair according to whether the first or second selection signal is activated, thereby outputting an amplified signal, wherein the first and second selection signals are generated on the basis of an input row address or column address.

The semiconductor memory device may further include: a first switch unit for coupling the write driver to the first memory section in response to the first selection signal; and a second switch unit for coupling the write driver to the second memory section in response to the second selection signal.

The first I/O line pair may include a first I/O line and a second I/O line, and the second I/O line pair may include a second I/O line and a second I/O line.

The sense-amplifier circuit may include: a first amplifier configured to detect/amplify a voltage difference between the first I/O line and the first I/O inversion line; a second amplifier configured to detect/amplify a voltage difference between the second I/O line and the second I/O inversion line; a third amplifier configured to amplify output signals of the first and second amplifiers; a third switch unit configured to apply the output signal of the first amplifier to the third amplifier in response to the first selection signal; and a fourth switch unit configured to apply the output signal of the second amplifier to the third amplifier in response to the second selection signal.

The first and second selection signals may be generated on the basis of an MSB value of the row address or column address.

The first and second selection signals may be activated at different time points.

The first and second sections may be distinguished from each other on the basis of a row address.

In accordance with another aspect of the embodiment, a memory system includes: a memory controller configured to determine an operation page unit on the basis of a program unit of a host application, and provide the determined operation page unit; and a semiconductor memory device configured to determine whether first and second sections contained in a memory bank, and distinguished from each other in units of a word line, are simultaneously activated on the basis of a received operation page, and operate in response to the determined result.

The semiconductor memory device may include: a memory bank configured to include a first section and a second section, each of which is comprised of a plurality of memory cells; a mode decoding circuit configured to generate page-size information by decoding a mode command signal; an LIO line switching circuit configured to generate first and second selection signals on the basis of the page-size information; and an input/output (I/O) circuit configured to access the first section, the second section, or the first and second sections on the basis of the first and second selection signals, wherein the page-size information includes first and second information, where, if the page-size information is the first information, the LIO line switching circuit generates the first and second selection signals using a row address, and if the page-size information is the second information, the LIO line switching circuit generates the first and second selection signals using a column address.

If the page-size information is the first information, any one of the first section or the second section may be activated in a unit operation period.

If the page-size information is the second information, the first and second sections may be simultaneously or sequentially activated in a unit operation period.

The I/O circuit may include: a write driver that is coupled to the first section through a first I/O line pair in response to the first selection signal, and is coupled to the second section through a second I/O line pair in response to the second selection signal, such that data is written in the first and second sections; and a sense-amplifier circuit configured to detect a voltage difference of the first I/O line pair or the second I/O line pair according to whether the first or second selection signal is activated, thereby outputting an amplified signal.

The first and second selection signals may be generated on the basis of an MSB value of an input row address or column address.

It is to be understood that both the foregoing general description and the following detailed description of the present invention are exemplary and explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. In association with embodiments of the present invention, specific structural and functional descriptions are disclosed only for illustrative purposes, embodiments of the present invention can be implemented in various ways without departing from the scope or spirit of the present invention.

Figure 1:
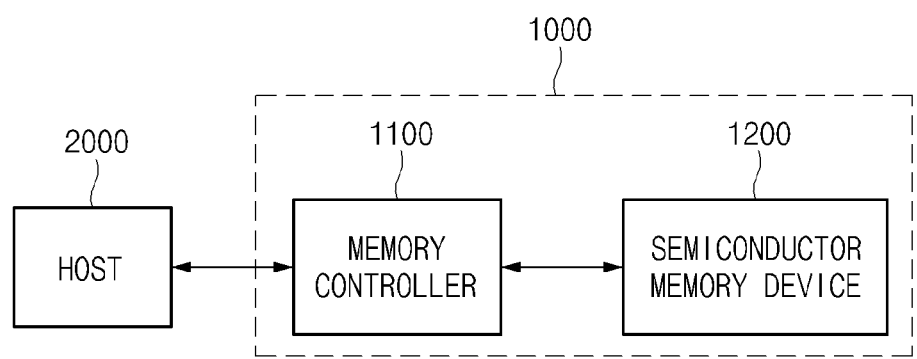
FIG. 1 is a block diagram illustrating a memory system according to one embodiment.

FIG. 1 is a block diagram illustrating a memory system according to one embodiment.

Referring to FIG. 1, the memory system 1000 according to one embodiment includes a memory controller 1100 and a semiconductor memory device 1200.

The memory controller 1100 is coupled to a host 2000 and the semiconductor memory device 1200. The memory controller 1100 accesses the semiconductor memory device 1200 in response to a request from the host 2000. For example, the memory controller 1100 may control read, write, and erase operations of the semiconductor memory device 1200. The memory controller 1100 provides an interface between the semiconductor memory device 1200 and the host 2000. The memory controller 1100 may drive firmware to control the semiconductor memory device 1200.

The semiconductor memory device 1200 may perform read, write, and/or erase operations requested by the memory controller 1100. For example, upon receiving a request from the memory controller 1100, the semiconductor memory device 1200 may read or write data on a page basis.

The memory controller 1100 may transfer a mode register write command (hereinafter referred to as a mode command) to the semiconductor memory device 1200. The mode command may be configured to have different information according to applications executed in the host 2000. The semiconductor memory device 1200 may variably establish the page size required for a read/write operation upon receiving a mode command from the memory controller 1100.

For example, assuming that the application executed in the host 2000 is an application requesting data of a large-size unit, the memory controller 1100 transmits the corresponding mode command to the semiconductor memory device 1200, and the semiconductor memory device 1200 may change the page size (for example, 4 KB) and then read/write data. On the other hand, assuming that the application executed in the host 2000 is an application requesting data of a small-size unit, the memory controller 1100 may transmit the corresponding mode command to the semiconductor memory device 1200, and the semiconductor memory device 1200 may change the page size (to for example, 2 KB), and then read/write data.

Figure 2:
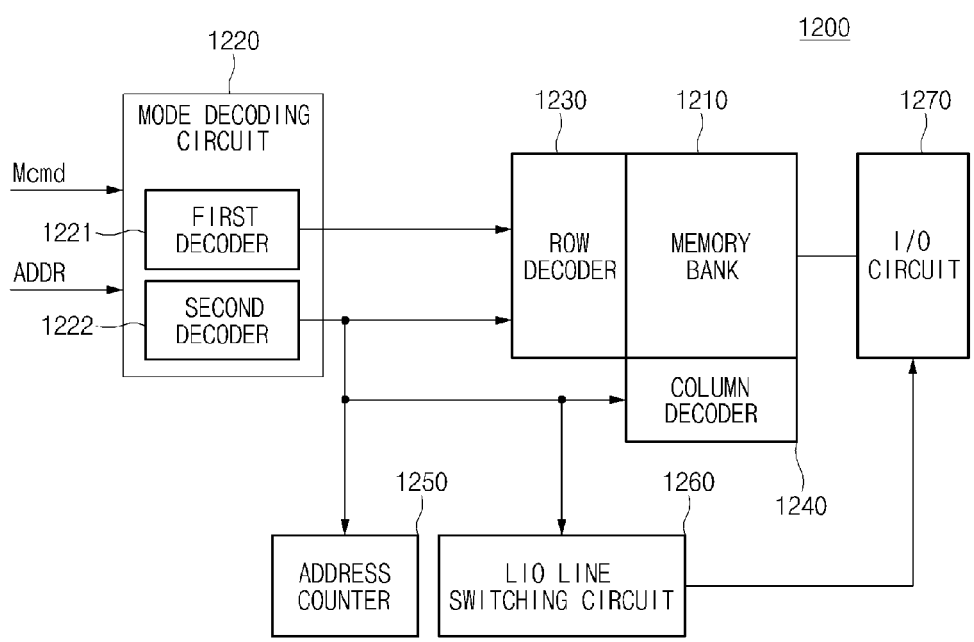
FIG. 2 is a block diagram illustrating a semiconductor memory device according to one embodiment.

In accordance with one embodiment, the memory controller 1100 may provide a mode command (Mcmd) in units of a block of the memory bank 1210 (See FIG. 2). The mode command (Mcmd) may be applied to the semiconductor memory device 1200 according to applications executed in the host 2000. For example, although the mode command (Mcmd) provides operation commands such as active, precharge, read, and write operations in units of the memory bank 1210, the semiconductor memory device 1200 according to one embodiment may generate operation commands in units of a block or section configured to construct the memory block. In response to generation of the above-mentioned operation command, the operation unit (i.e., page size) of the semiconductor memory device 1200 may be determined.

As described above, the semiconductor memory device 1200 of the memory system 1000 can optimize a page size according to an application executed in the host 2000. Detailed operations and structures of the semiconductor memory device 1200 will hereinafter be described with reference to FIGS. 2 to 6.

FIG. 2 is a block diagram illustrating a semiconductor memory device according to an example embodiment of the present invention. Although FIG. 2 shows, for example, a single memory bank 1210 for convenience of description, the scope and spirit of the present invention is not limited thereto. In other embodiments, the semiconductor memory device 1200 may include a plurality of memory banks 1210.

Referring to FIG. 2, the semiconductor memory device 1200 may include a memory bank 1210, a mode decoding circuit 1220, a row decoder 1230, a column decoder 1240, an address counter 1250, an LIO (local input and output) line switching circuit 1260, and an I/O circuit 1270.

The memory bank 1210 may be coupled to the row decoder 1230 through word lines WL, and may be coupled to the column decoder 1240 through bit lines BL. The memory bank 1210 may include a plurality of memory cells at an intersection region of the word lines WL and the bit lines BL. The memory bank 1210 may include a plurality of sections, each of which is comprised of a plurality of memory cells. For example, memory cells arranged in a row direction are coupled to the word lines WL, and memory cells arranged in a column direction are coupled to the bit lines BL. For example, the memory bank 1210 may store data of at least one bit in a single cell.

The memory bank 1210 may include a plurality of memory blocks, and the memory blocks may be configured on a page basis.

The mode decoding circuit 1220 may receive the mode command (Mcmd) and the address (ADDR) from the memory controller 1100 shown in FIG. 1. The address ADDR may include a row address (X-ADDR) and a column address (Y-ADDR).

The mode decoding circuit 1220 may include a first decoder 1221 and a second decoder 1222. The first decoder 1221 may decode the mode command (Mcmd) so as to generate word-line activation information. For example, assuming that the mode decoding circuit 1220 operates in units of a large-sized page, two or more different word lines may be simultaneously activated, or two or more different word lines may be sequentially activated at intervals of a predetermined time. The above word-line activation scheme may be decided on the basis of the mode command (Mcmd).

The first decoder 1221 may transmit the word-line activation information to the row decoder 1230. The second decoder 1222 may decode the mode command (Mcmd) so as to generate page-size information. For example, the page-size information may include 2 KB page size information and/or 4 KB page size information. The second decoder 1222 may transmit the generated page-size information to the row decoder 1230, the column decoder 1240, the address counter 1250, and the LIO line switching circuit 1260.

The row decoder 1230 may decode a row address (X-ADDR) received from the mode decoding circuit 1220. The row decoder 1230 may activate the word line (WL) using the word-line activation information received from the first decoder 1221 and the decoded row address.

The column decoder 1240 may decode a column address (Y-ADDR) received from the mode decoding circuit 1220. The decoded column address is transferred to the I/O circuit 1270.

The address counter 1250 may use an address (ADDR) (in one example, ADDR may correspond to a start address of a specific bank or block) as a start point. The address counter 1250 may be incremented or decremented a predetermined amount from the start address to arrive at resultant address, such that the resultant address may be applied to the row decoder 1230 and the column decoder 1240. For example, the address counter 1250 may be used for a burst operation.

The LIO line switching circuit 1260 may generate a first selection signal $SEC_{selA}$ and a second selection signal $SEC_{selB}$ on the basis of the page-size information received from the second decoder 1222. For example, assuming that the page-size information is 2 KB-sized information, the LIO line switching circuit 1260 may sequentially perform the LIO line switching using a general method (for example, a first selection signal $SEC_{selA}$ and a second selection signal $SEC_{selB}$ may be generated on the basis of a row address). However, assuming that the page-size information of 4 KB-sized information is larger than a general page size, data segments from respective sections may collide with each other when the LIO line is activated to read/write this larger page size. Therefore, the first selection signal $SEC_{selA}$ and the second selection signal $SEC_{selB}$ may be generated on the basis of a column address.

In more detail, the LIO line switching circuit 1260 may generate the first selection signal $SEC_{selA}$ and the second selection signal $SEC_{selB}$ according to a most significant bit (MSB) value of the column address. Detailed operations of the LIO line switching circuit 1260 will hereinafter be described with reference to FIGS. 3 to 6.

The I/O circuit 1270 may read data from the memory bank 1210 or may write data to the memory bank 1210 in response to the first selection signal $SEC_{selA}$ and the second selection signal $SEC_{selB}$ received from the LIO line switching circuit 1260.

Figure 3:
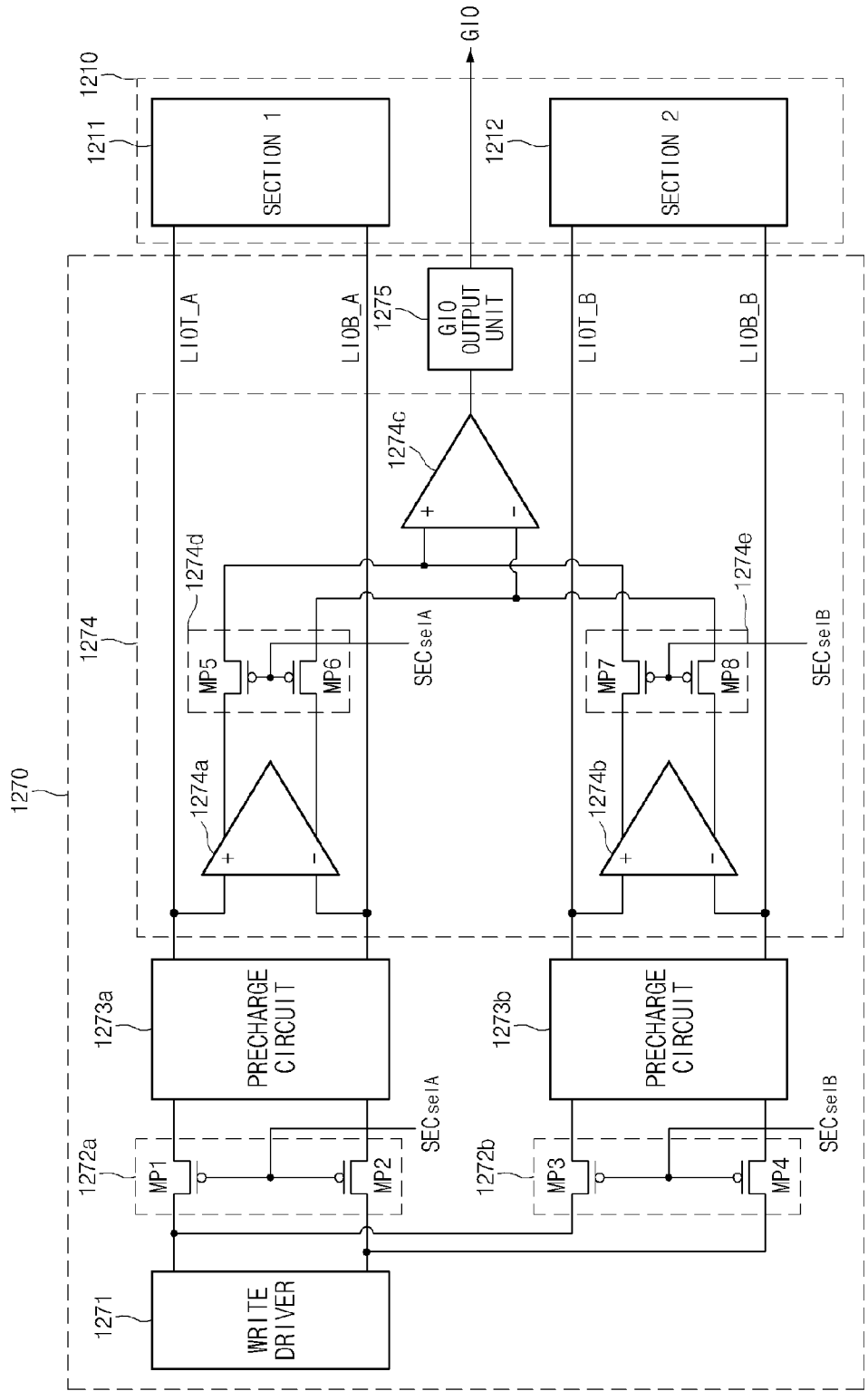
FIG. 3 is a detailed circuit diagram illustrating a memory bank and an I/O circuit of the semiconductor memory device shown in FIG. 2.

FIG. 3 is a detailed circuit diagram illustrating a memory bank and an I/O circuit of the semiconductor memory device shown in FIG. 2. Although the memory bank 1210 includes two sections (i.e., the first section 1211 and the second section 1212) for convenience of description, the scope and spirit of the present invention is not limited thereto. For example, the first section 1211 and the second section 1212 may be distinguished from each other on the basis of a row address, each of the first section 1211 and the second section 1212 may correspond to one page.

The semiconductor memory device according to one embodiment includes the first section 1211 and the second section 1212. The first section 1211 and the second section 1212 may generally exist on an operation basis. However, assuming that each of the first section 1211 and the second section 1212 is operated in units of a single operation by the mode command (Mcmd), i.e., assuming that each of the first section 1211 and the second section 1212 is operated on a 4 KB-basis, the two sections 1211 and 1212 may operate as a single operation unit.

Referring to FIG. 3, the I/O circuit 1270 may include a write driver 1271, a first switch unit 1272a, a second switch unit 1272b, precharge circuits 1273a and 1273b, a sense-amplifier circuit 1274, and a GIO output unit 1275. A first I/O line LIOT_A and a first I/O inversion line LIOB_A may comprise a first I/O line pair. A second I/O line LIOT_B and a second I/O inversion line LIOB_B may comprise a second I/O line pair.

The write driver 1271 is coupled to the first section 1211 through the first I/O line LIOT_A and the first I/O inversion line LIOB_A. The write driver 1271 is coupled to the second section 1212 through the second I/O line LIOT_B and the second I/O inversion line LIOB_B. The write driver 1271 may be configured to write data in the first section 1211 and the second section 1212. That is, it may be appreciated that the first section 1211 and the second section 1212 share the write driver 1271.

The first switch unit 1272a may be coupled to the write driver 1271 through the first I/O line LIOT_A and the first I/O inversion line LIOB_A. The first switch unit 1272a may couple the write driver 1271 to the first section 1211 in response to the first selection signal $SEC_{selA}$. The first switch unit 1272a includes a first PMOS transistor MP1, first and second terminals of which are serially coupled to the first I/O line LIOT_A. The first PMOS transistor MP1 receives the first selection signal $SEC_{selA}$ through a gate terminal. The first PMOS transistor MP1 may interconnect the write driver 1271 and the first I/O line LIOT_A in response to the first selection signal $SEC_{selA}$. The first switch unit 1272a includes a second PMOS transistor MP2, first and second terminals of which are serially coupled to the first I/O inversion line LIOB_A. The second PMOS transistor MP2 receives the first selection signal $SEC_{selA}$ through a gate terminal. The gate terminal of the first PMOS transistor MP1 may be coupled to the gate terminal of the second PMOS transistor MP2.

The second switch unit 1272b may be coupled to the write driver 1271 through the second I/O line LIOT_B and the second I/O inversion line LIOB_B. The second switch unit 1272b may couple the write driver 1271 to the second section 1212 in response to the second selection signal $SEC_{selB}$. The second switch unit 1272b may include a third PMOS transistor MP3 and a fourth PMOS transistor MP4. First and second terminals of the third PMOS transistor MP3 are serially coupled to the second I/O line LIOT_B. The third PMOS transistor MP3 receives the second selection signal $SEC_{selB}$ through a gate terminal. First and second terminals of the fourth PMOS transistor MP4 are serially coupled to the second I/O inversion line LIOB_B. The fourth PMOS transistor MP4 receives the second selection signal $SEC_{selB}$ through a gate terminal. The gate terminal of the third PMOS transistor MP3 may be coupled to the gate terminal of the fourth PMOS transistor MP4.

That is, the write driver 1271 may be coupled to the first section 1211 or the second section 1212 according to whether the first selection signal $SEC_{selA}$ or the second selection signal $SEC_{selB}$ is activated.

Although the first switch unit 1272a and the second switch unit 1272b are implemented as PMOS transistors for convenience of description, the scope or spirit of the present invention is not limited thereto. The first and second switch units 1272a and 1272b may be implemented in various ways for such switching operations.

The precharge circuit 1273a may be coupled to the first I/O line LIOT_A and the first I/O inversion line LIOB_A. The precharge circuit 1273b may be coupled to the second I/O line LIOT_B and the second I/O inversion line LIOB_B, such that the precharge circuits 1273a and 1273b may perform the precharge operation.

The sense-amplifier circuit 1274 detects a difference in voltage between the first I/O line LIOT_A and the first I/O inversion line LIOB_A, and/or detects a difference in voltage between the second I/O line LIOT_B and the second I/O inversion line LIOB_B, such that sense-amplifier circuit 1274 may output the amplified signal. The sense-amplifier circuit 1274 is coupled to the first I/O line LIOT_A and the first I/O inversion line LIOB_A in response to the first selection signal $SEC_{selA}$. The sense-amplifier circuit 1274 may be coupled to the second I/O line LIOT_B and the second I/O inversion line LIOB_B in response to the second selection signal $SEC_{selB}$.

The sense-amplifier circuit 1274 may be coupled to one I/O line pair at a specific time. The first selection signal $SEC_{selA}$ and the second selection signal $SEC_{selB}$ may be complementary to each other in operation (that is, when the first selection signal $SEC_{selA}$ is activated, the second selection signal $SEC_{selB}$ may deactivated, and vice-versa). Or, the first selection signal $SEC_{selA}$ and the second selection signal $SEC_{selB}$ may be deactivated at a specific time as necessary.

The sense-amplifier circuit 1274 may include a first amplifier 1274a, a second amplifier 1274b, a third amplifier 1274c, a third switch unit 1274d, and a fourth switch unit 1274e.

The first amplifier 1274a may detect a difference in voltage between the first I/O line LIOT_A and the first I/O inversion line LIOB_A, and amplify the detected voltage difference.

The second amplifier 1274b may detect a difference in voltage between the second I/O line LIOT_B and the second I/O inversion line LIOB_B, and amplify the detected voltage difference.

The third amplifier 1274c may amplify the output signals of the first amplifier 1274a and the second amplifier 1274b, and output the amplified signals.

The third switch unit 1274d may apply the output signal of the first amplifier 1274a to the third amplifier 1274c in response to the first selection signal $SEC_{selA}$. That is, the third switch unit 1274d may couple an output terminal of the first amplifier 1274a to an input terminal of the third amplifier 1274c in response to the first selection signal $SEC_{selA}$.

The fourth switch unit 1274e may apply the output signal of the second amplifier 1274b to the third amplifier 1274c in response to the second selection signal $SEC_{selB}$. That is, the fourth switch unit 1274e may couple the output terminal of the second amplifier 1274b to the input terminal of the third amplifier 1274c in response to the second selection signal $SEC_{selB}$.

That is, the third amplifier 1274c may be coupled to the first amplifier 1274a or the second amplifier 1274b according to whether the first selection signal $SEC_{selA}$ or the second selection signal $SEC_{selB}$ is activated.

In accordance with an embodiment, the first amplifier 1274a and the second amplifier 1274b may be configured in a substantially similar manner. However, a configuration of the third amplifier 1274c may be different from a configuration the first amplifier 1274a and/or the second amplifier 1274b.

The GIO output unit 1275 may latch an output signal of the third amplifier 1274c, and then output the latched signal to a global input/output (GIO) line.

Figure 4:
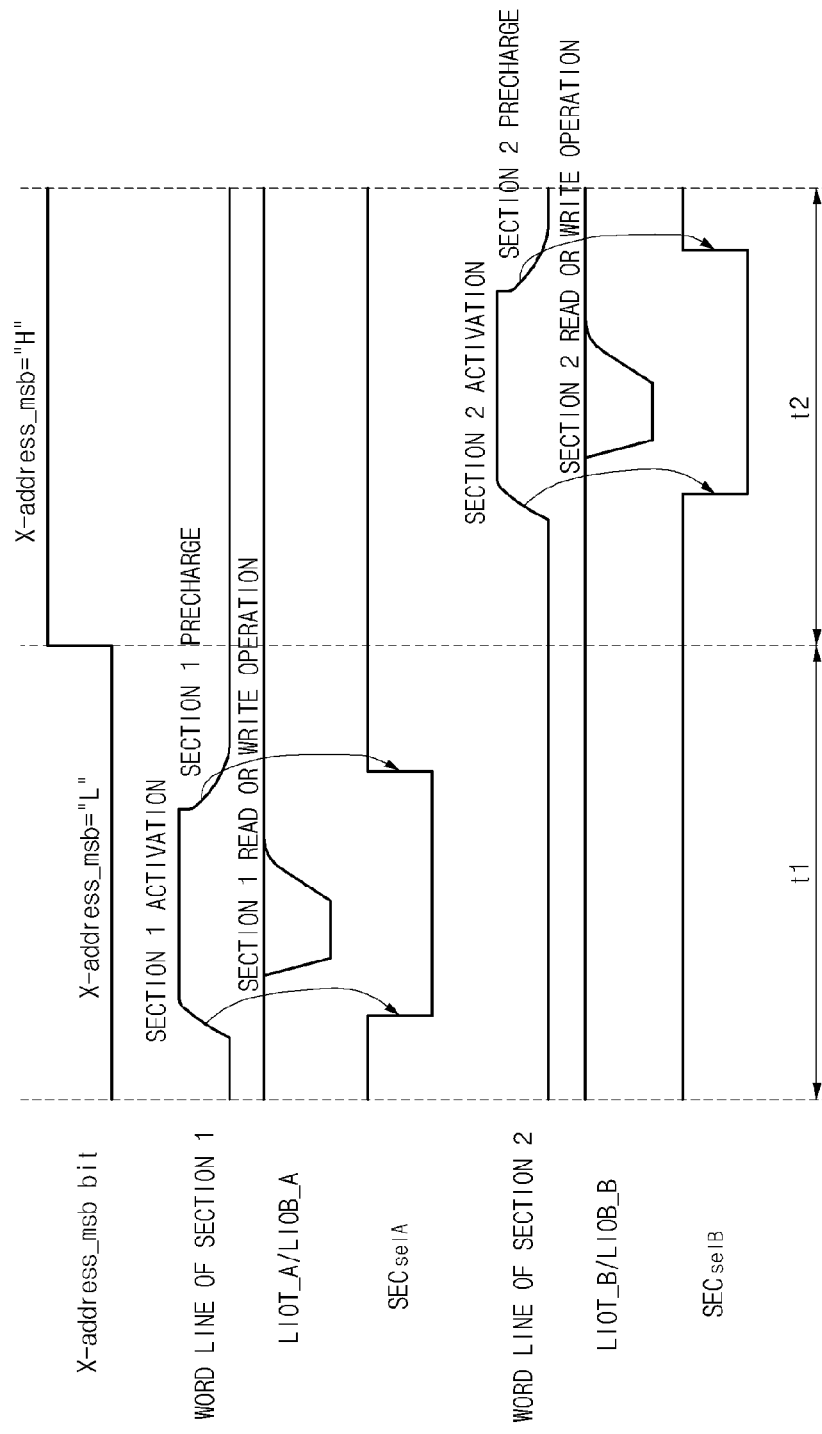
FIGS. 4 to 6 are timing diagrams illustrating operations of the circuit shown in FIG. 3 according to embodiments.

FIG. 4 is a timing diagram illustrating operations of the circuit shown in FIG. 3 according to some embodiments.

The embodiment of FIG. 4 shows an example where page-size information applied to the LIO line switching circuit 1260 is 2 KB-sized information. The first selection signal $SEC_{selA}$ and the second selection signal $SEC_{selB}$ may be generated on the basis of a row address (X-address). It is assumed that, if the MSB value of the row address indicates a logical low state (L), a word line of the first section 1211 is activated, and if the MSB value of the row address indicates a logical high state (H), a word line of the second section 1212 is activated. Thus, it may be said that the semiconductor memory device 1200 may be configured such that the first section 1211 and the second section 1212 may be distinguished from each other based on units of a word line. A first time period (t1) and a second time period (t2) may be defined as a RAS Cycle time (tRC). 'tRC' may indicate a unit operation period of the semiconductor memory device.

However, the above-mentioned description is only one example, and the first selection signal $SEC_{selA}$ and the second selection signal $SEC_{selB}$ may be activated at an activation time point of each section. Therefore, the first selection signal $SEC_{selA}$ and the second selection signal $SEC_{selB}$ may be activated at different times according to section arrangement, and may not depend on the row address value. In addition, the first time period (t1) and the second time period t2 may be defined by different time units.

Referring to FIGS. 3 and 4, assuming that the MSB value of the row address indicates a logical low state (L), a word line of the first section 1211 corresponding to the row address will be activated. In addition, the first selection signal $SEC_{selA}$ will be activated and the second selection signal $SEC_{selB}$ will be deactivated. If the first selection signal $SEC_{selA}$ is activated, the first switch unit 1272a is turned on, such that the write driver 1271 will be coupled to the first section 1211. In addition, if the first selection signal $SEC_{selA}$ is activated, the third switch unit 1274d is turned on such that the first amplifier 1274a and the third amplifier 1274c of the sense-amplifier circuit 1274 are coupled to each other. In other words, a data write or read operation of the first section 1211 is carried out in the first time period t1.

Assuming that the MSB value of the row address is a logical high state (H), the word line of the second section 1212 corresponding to the row address is activated. In addition, the first selection signal $SEC_{selA}$ is deactivated and the second selection signal $SEC_{selB}$ is activated. If the second selection signal $SEC_{selB}$ is activated, the second switch unit 1272b is turned on such that the write driver 1271 will be coupled to the second section 1212. In addition, if the second selection signal $SEC_{selB}$ is activated, the fourth switch unit 1274e is turned on, such that the second amplifier 1274b and the third amplifier 1274c of the sense-amplifier circuit 1274 are coupled to each other. In other words, the data write or read operation of the second section 1212 is carried out in the second time period t2.

Therefore, the semiconductor memory device according to one embodiment is configured to input/output data to/from the first section 1211 and the second section 1212 in the first time period t1 and the second time period t2 respectively, such that the data write or read operation can be carried out without data collision. That is, according to the above-mentioned embodiment, the first section 1211 and the second section 1212 are configured to share the write driver 1272, resulting in reduction of a chip area.

Figure 5:
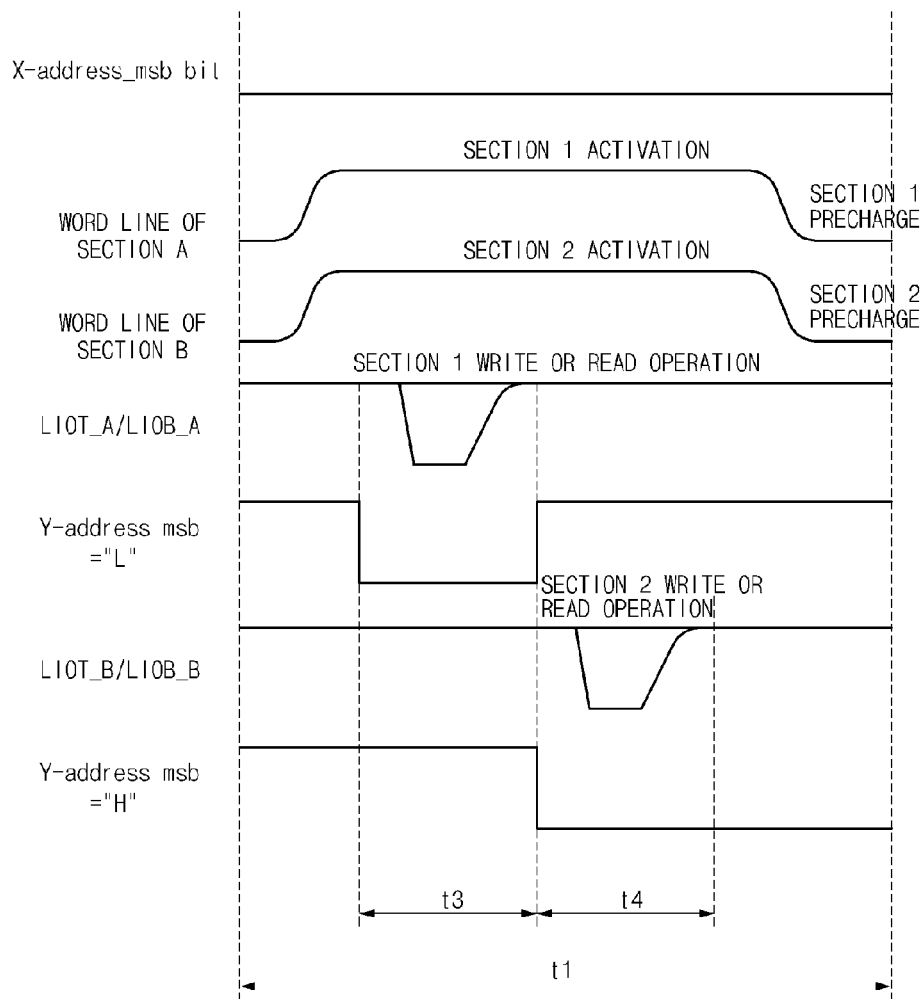

FIG. 5 is a timing diagram illustrating operations of the circuit shown in FIG. 3 according to some embodiments.

The embodiment of FIG. 5 shows an example where page-size information applied to the LIO line switching circuit 1260 is 4 KB-sized information. In the present example, it is assumed that the word line of the first section 1211 and the word line of the second section 1212 are simultaneously activated in the first time period t1. Thus, in one embodiment, the semiconductor memory device 1200 may be configured to determine whether the first section 1211 and second section 1212 are simultaneously activated on the basis of a received operation page (i.e., the page size information), and the semiconductor memory device 1200 may be configured to operate in response to the determined result. A third time period t3 and a fourth time period t4 may be defined by a tCCD (CAS to CAS Delay) section.

In this case, the semiconductor memory device 1200 may receive a simultaneous activation command of two sections from the memory controller 1100, and it can be appreciated that the semiconductor memory device 1200 simultaneously receives activation commands for the two sections. The semiconductor memory device 1100 according to one embodiment may receive an operation command for each section or each block contained in a single memory bank 1210.

Referring to FIG. 5, in contrast to the embodiment of FIG. 4, the first selection signal $SEC_{selA}$ and the second selection signal $SEC_{selB}$ are generated on the basis of a column address. That is, if the MSB value of the column address indicates a logical low state L (i.e., t3 period), the first selection signal $SEC_{selA}$ is activated and the second selection signal $SEC_{selB}$ is deactivated. In addition, if the MSB value of the column address indicates a logical high value H (i.e., t4 period), the first selection signal $SEC_{selA}$ is deactivated and the second selection signal $SEC_{selB}$ is activated.

Therefore, the data write or read operation for the first section 1211 may be carried out in the third time period t3, and the data write or read operation for the second section 1212 may be carried out in the fourth time period t4.

That is, although the word lines of the first and second sections 1211 and 1212 are simultaneously precharged and activated in the first time period t1, since the switching operation of output data is carried out on a tCCD (CAS to CAS Delay) basis according to the column address, data segments of different sections may be read or written during the first time period t1. The above-mentioned operation may result in improvement of data throughput.

That is, as can be seen from FIG. 5, a specific time at which the LIO lines (LIOT_A/LIOB_A, LIOT_B/LIOB_B) are coupled to the write driver 1271 or the sense-amplifier circuit 1274 may be controlled by the first selection signal $SEC_{selA}$ and the second selection signal $SEC_{selB}$ that are generated on the basis of a column address. Therefore, the GIO output unit 1275 may sequentially perform the data I/O operations, such that the GIO output unit 1275 may operate in units of a page size corresponding to the sum of the two sections 1211 and 1212.

Furthermore, word lines for activating respective sections are simultaneously activated and precharged, such that operation speed is improved.

Figure 6:
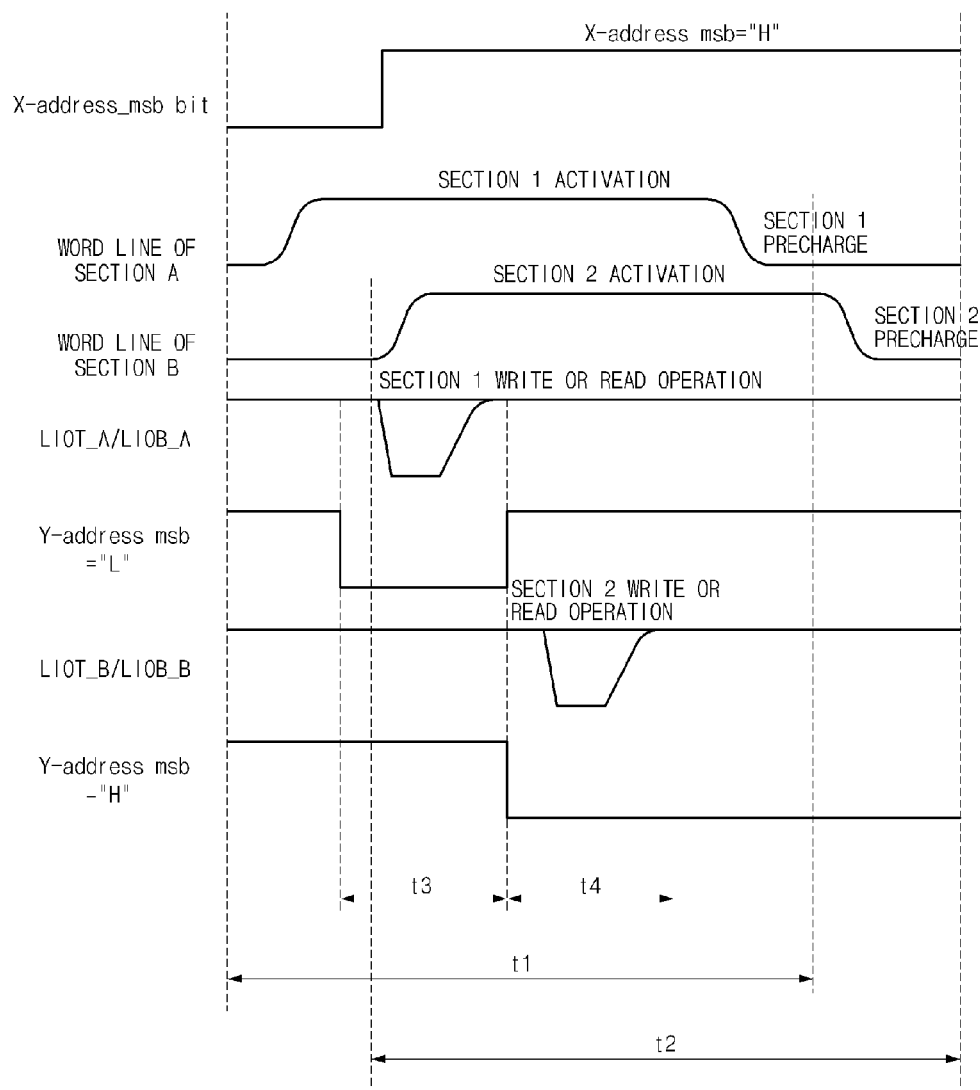

FIG. 6 is a timing diagram illustrating operations of the circuit shown in FIG. 3 according to some embodiments.

The embodiment of FIG. 6 shows an example where page-size information applied to the LIO line switching circuit 1260 is 4 KB-sized information. It is assumed that word lines of the first section 1211 are sequentially activated in the first time period t1 and word lines of the second section 1212 are sequentially activated in the second time period t2. In other words, the first section 1211 and the second section 1212 may be activated in sequence.

Compared to FIG. 5, the semiconductor memory device may receive the operation command signal of each section from the memory controller 1100 at intervals of a predetermined time. For example, after lapse of a predetermined time at which the semiconductor memory device receives the activation command of the first section 1211, the semiconductor memory device may receive the activation command of the second section 1212.

Accordingly, the data write or read operation of the first section 1211 may be carried out in the third time period t3, and the data write or read operation of the second section 1212 may be carried out in the fourth time period t4. In contrast to the embodiment of FIG. 5, the word line of the first section 1211 and the word line of the second section 1212 are sequentially activated and precharged, such that a peak current may be reduced and noise generated in the memory bank 1212 (See FIG. 3) may also be reduced.

Hereafter, other operations of FIG. 6 are substantially identical to those of FIG. 5, and as such a detailed description thereof will be omitted for convenience of description. As can be seen from FIG. 6, the first section 1211 may be coupled to the sense-amplifier circuit 1274 and the write driver 1271 during the time period t3, and the second section 1212 may be coupled to the sense-amplifier circuit 1274 and the write driver 1271 during the time period t4.

As is apparent from the above description, the semiconductor memory device and the memory system according to the embodiments can reduce the number of write drivers and the number of amplifiers of the I/O sense circuit, resulting in reduction of a chip area.

The semiconductor memory device and the memory system according to embodiments can optimize the page size according to applications executed in the host.

Those skilled in the art will appreciate that embodiments may be carried out in other specific ways than those set forth herein without departing from the spirit and essential characteristics of the present invention. The above embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an example embodiment or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
   a memory bank including a first section and a second section, each of which being comprised of a plurality of memory cells and a first word line of the first section and a second word line of the second section being different from each other;
   a row decoder configured to activate the first word line and the second word line such that a first activated period of the first word line overlaps with a second activated period of the second word line;
   an LIO (Local input and output) line switching circuit configured to generate first and second selection signals, the first selection signal being activated while the first word line is activated, and the second selection signal being activated while the second word line is activated; and
   an input/output (I/O) circuit configured to access the first section based on the first selection signal and access the second section based on the second selection signal.

2. The semiconductor memory device according to claim 1, wherein:
   the LIO line switching circuit generates first and second selection signals based on the page-size information including first information and second information,
   if the page-size information is the first information, any one of the first word line of the first section and the second word line of the second section is activated in a unit operation period.

3. The semiconductor memory device according to claim 2, wherein:
   if the page-size information is the second information, the first and the second word lines of the first and second sections are simultaneously or sequentially activated in a unit operation period.

4. The semiconductor memory device according to claim 1, wherein the I/O circuit includes:
   a write driver that is coupled to the first section through a first I/O line pair in response to the first selection signal, and is coupled to the second section through a second I/O line pair in response to the second selection signal, such that data is written in the first and second sections; and
   a sense-amplifier circuit configured to detect a voltage difference of the first I/O line pair or the second I/O line pair according to whether the first or second selection signal is activated, thereby outputting an amplified signal.

5. The semiconductor memory device according to claim 4, wherein:
   the first I/O line pair includes a first I/O line and a first I/O inversion line, and
   the second I/O line pair includes a second I/O line and a second I/O inversion line.

6. The semiconductor memory device according to claim 5, wherein the sense-amplifier circuit includes:
   a first amplifier configured to detect/amplify a voltage difference between the first I/O line and the first I/O inversion line;
   a second amplifier configured to detect/amplify a voltage difference between the second I/O line and the second I/O inversion line;
   a third amplifier configured to amplify output signals of the first and second amplifiers;
   a first switch unit configured to apply the output signal of the first amplifier to the third amplifier in response to the first selection signal; and
   a second switch unit configured to apply the output signal of the second amplifier to the third amplifier in response to the second selection signal.

7. The semiconductor memory device according to claim 1, wherein the first and second selection signals are generated on the basis of an MSB value of a row address or column address.

8. A semiconductor memory device comprising:
a write driver that is coupled to a first memory section through a first I/O line pair in response to a first selection signal, and is coupled to a second memory section through a second I/O line pair in response to a second selection signal, such that data is written in the first and second sections, a first word line of the first section and a second word line of the second section being different from each other; and
a sense-amplifier circuit configured to detect a voltage difference of the first I/O line pair or the second I/O line pair according to whether the first or second selection signal is activated, thereby outputting an amplified signal,
wherein the first and second selection signals are activated at different time points.

9. The semiconductor memory device according to claim 8, further comprising:
a first switch unit for coupling the write driver to the first memory section in response to the first selection signal; and
a second switch unit for coupling the write driver to the second memory section in response to the second selection signal.

10. The semiconductor memory device according to claim 8, wherein:
the first I/O line pair includes a first I/O line and a second I/O line, and
the second I/O line pair includes a second I/O line and a second I/O line.

11. The semiconductor memory device according to claim 10, wherein the sense-amplifier circuit includes:
a first amplifier configured to detect/amplify a voltage difference between the first I/O line and the first I/O inversion line;
a second amplifier configured to detect/amplify a voltage difference between the second I/O line and the second I/O inversion line;
a third amplifier configured to amplify output signals of the first and second amplifiers;
a third switch unit configured to apply the output signal of the first amplifier to the third amplifier in response to the first selection signal; and
a fourth switch unit configured to apply the output signal of the second amplifier to the third amplifier in response to the second selection signal.

12. The semiconductor memory device according to claim 8, wherein the first and second selection signals are generated on the basis of an input row address or column address, and
wherein the first and second selection signals are generated on the basis of an MSB value of the row address or column address.

13. The semiconductor memory device according to claim 8, wherein the first and second selection signals are activated at different time points.

14. The semiconductor memory device according to claim 8, wherein the first and second sections are distinguished from each other on the basis of a row address.

15. A memory system comprising:
a memory controller configured to determine an operation page unit on the basis of a program unit of a host application, and provide the determined operation page unit; and
a semiconductor memory device configured to determine whether first and second sections contained in a memory bank, distinguished from each other in units of a word line, are simultaneously activated on the basis of a received operation page, and operate in response to the determined result.

16. The memory system according to claim 15, wherein the semiconductor memory device includes:
a memory bank configured to include a first section and a second section, each of which is comprised of a plurality of memory cells;
a mode decoding circuit configured to generate page-size information by decoding a mode command signal;
an LIO line switching circuit configured to generate first and second selection signals on the basis of the page-size information; and
an input/output (I/O) circuit configured to access the first section, the second section, or the first and second sections on the basis of the first and second selection signals,
wherein the page-size information includes first and second information,
where, if the page-size information is the first information, the LIO line switching circuit generates the first and second selection signals using a row address, and if the page-size information is the second information, the LIO line switching circuit generates the first and second selection signals using a column address.

17. The memory system according to claim 16, wherein:
if the page-size information is the first information, any one of the first section or the second section is activated in a unit operation period.

18. The memory system according to claim 16, wherein:
if the page-size information is the second information, the first and second sections are simultaneously or sequentially activated in a unit operation period.

19. The memory device according to claim 16, wherein the I/O circuit includes:
a write driver that is coupled to the first section through a first I/O line pair in response to the first selection signal, and is coupled to the second section through a second I/O line pair in response to the second selection signal, such that data is written in the first and second sections; and
a sense-amplifier circuit configured to detect a voltage difference of the first I/O line pair or the second I/O line pair according to whether the first or second selection signal is activated, thereby outputting an amplified signal.

20. The memory system according to claim 16, wherein the first and second selection signals are generated on the basis of an MSB value of an input row address or column address.

* * * * *